(12) United States Patent
Kang et al.

(10) Patent No.: US 7,786,581 B2
(45) Date of Patent: Aug. 31, 2010

(54) METHOD OF MANUFACTURING A SEMICONDUCTOR DEVICE HAVING AN EVEN COATING THICKNESS USING ELECTRO-LESS PLATING, AND RELATED DEVICE

(75) Inventors: Un Byoung Kang, Hwaseong-si (KR); Yong Hwan Kwon, Suwon-si (KR); Chung Sun Lee, Sungnam-si (KR); Woon Seong Kwon, Suwon-si (KR); Hyung Sun Jang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 66 days.

(21) Appl. No.: 12/073,310

(22) Filed: Mar. 4, 2008

(65) Prior Publication Data
US 2008/0258299 A1   Oct. 23, 2008

(30) Foreign Application Priority Data
Apr. 20, 2007   (KR) .................... 10-2007-0038981

(51) Int. Cl.
*H01L 23/48* (2006.01)
(52) U.S. Cl. .................. 257/737; 438/613; 438/606; 438/652; 438/627; 438/643

(58) Field of Classification Search ................. 257/737, 257/742, 743, 75, 751, E23.01, E21.476, 257/750; 438/613, 627, 643, 653, 927
See application file for complete search history.

(56) References Cited

U.S. PATENT DOCUMENTS

| 6,042,929 | A | * | 3/2000 | Burke et al. ................. 428/141 |
| 7,008,867 | B2 |  | 3/2006 | Lei |
| 7,135,770 | B2 |  | 11/2006 | Nishiyama et al. |
| 2002/0001670 | A1 | * | 1/2002 | Pauw et al. .................... 427/98 |
| 2008/0194095 | A1 | * | 8/2008 | Daubenspeck et al. ....... 438/612 |

* cited by examiner

*Primary Examiner*—Wai-Sing Louie
*Assistant Examiner*—Sue Tang
(74) *Attorney, Agent, or Firm*—Lee & Morse, P.C.

(57) ABSTRACT

A method of manufacturing a semiconductor device includes forming a diffusion barrier layer on a substrate, and forming at least two features on the substrate such that the diffusion barrier layer is respectively disposed between each feature and the substrate and contacts the at least two features. A first impurity region of the substrate contains impurities of a first type, a second impurity region of the substrate contains impurities of a second type, different from the first type, a first feature of the at least two features is in the first impurity region, and a second feature of the at least two features is in the second impurity region, such that the second feature is electrically isolated from first feature by the different impurity regions.

10 Claims, 12 Drawing Sheets

METHOD OF MANUFACTURING A SEMICONDUCTOR DEVICE HAVING AN EVEN COATING THICKNESS USING ELECTRO-LESS PLATING, AND RELATED DEVICE

BACKGROUND OF THE INVENTION

1. Field of the Invention

Embodiments relate to a method of manufacturing a semiconductor device and, more particularly, to a method of manufacturing a semiconductor device having an even coating thickness using electro-less plating, and a device made thereby.

2. Description of the Related Art

Generally, electroplating and electro-less plating may be used to deposit a material layer, e.g., a conductive layer, on a substrate. Electroplating typically involves exposing a target substrate to a metal-containing solution, in which metal ions are dissolved in acid, and driving a reduction reaction using an applied electric potential so as to convert the metal ions to a metal layer on the substrate. For example, the substrate may be immersed in the metal-containing solution while being connected as a cathode of the electrical circuit. The cathode may be connected to a first pole of a power source, and an anode connected to an opposite pole of the power source may be immersed in the solution to complete an electrical circuit.

Unlike conventional electroplating, electro-less plating does not depend on the application of an external electrical potential to drive the plating process. Electro-less plating may be a desirable alternative to electroplating, because the relatively simple electro-less plating process may require less equipment and lower costs as compared to electroplating. Further, electro-less plating may be employed to form a metal layer on sidewalls and a top portion of a bump, whereas electroplating may form a metal layer only on the top portion of the bump.

It is commonly understood that even non-conductive substrates may be plated using electro-less plating, i.e., conductivity of the substrate is not required. However, where finely-patterned features are to be plated using electro-less plating, a difference in electrical potential between similar features formed on the substrate may result in those features being unevenly plated. Thus, in the fabrication of a semiconductor device having finely-patterned features such as, e.g., bumps, wiring patterns, etc., variations in plating thickness may occur when using an electro-less plating process, and the variations in plating thickness may reduce the reliability of the semiconductor device.

SUMMARY OF THE INVENTION

Embodiments are therefore directed to a method of manufacturing a semiconductor device having an even coating thickness using electro-less plating, and a related device, which substantially overcome one or more of the problems due to the limitations and disadvantages of the related art.

Embodiments therefore provide a method of electro-less plating suitable for plating features that are located in regions of a substrate that contain impurities of differing types.

Embodiments also provide a device including features having an outer conductive layer, the features being located in regions of a substrate that contain impurities of differing types.

At least one of the above and other advantages may be realized by providing a method of manufacturing a semiconductor device, including forming a diffusion barrier layer on a substrate, and forming at least two features on the substrate such that the diffusion barrier layer is respectively disposed between each feature and the substrate and contacts the at least two features. A first impurity region of the substrate may contain impurities of a first type, a second impurity region of the substrate may contain impurities of a second type, different from the first type, a first feature of the at least two features may be in the first impurity region, and a second feature of the at least two features may be in the second impurity region, such that the second feature is electrically isolated from first feature by the different impurity regions.

The diffusion barrier layer may provide an electrical path between the at least two features, and the method may further include electro-less plating an outer conductive layer on the at least two features while the at least two features are connected by the electrical path, and, after the electro-less plating, processing the diffusion barrier layer so as to interrupt the electrical path. Processing the diffusion barrier layer so as to interrupt the electrical path may include removing the diffusion barrier layer from a region surrounding at least one of the at least two features. After interrupting the electrical path, the diffusion barrier layer may extend laterally to an outer edge of the conductive layer and is exposed by the conductive layer.

The conductive layer may be plated on a surface of the features that includes one or more of copper or nickel, the conductive layer may include one or more of nickel, gold, palladium, tin, or indium, and the diffusion barrier layer may include one or more of titanium, chromium, or aluminum. The conductive layer may include a palladium layer on the surface of each feature, a nickel layer on each palladium layer, and at least one gold layer on each palladium layer.

The method may further include, after forming the diffusion barrier layer and before the electro-less plating, forming a seed layer on the substrate, selectively forming the at least two features on the seed layer, and selectively removing the seed layer from a region between the at least two features. The at least two features may be formed by electroplating or electro-less plating. Forming the at least two features may include forming a seed layer on the substrate, forming a photoresist pattern on the substrate, the photoresist pattern having openings corresponding to the at least two features, the openings exposing the seed layer, depositing a material in the openings in the photoresist pattern using electroplating, planarizing the deposited material to form the at least two features, removing the photoresist pattern, and removing portions of the seed layer exposed on the substrate adjacent to the at least two features. The seed layer may be conductive.

A portion of the diffusion barrier layer that provides the electrical path may be exposed during the electro-less plating. The method may further include, before the electro-less plating, subjecting the exposed portion of the diffusion barrier layer that provides the electrical path to an oxygen plasma surface treatment.

At least one of the above and other advantages may also be realized by providing a semiconductor device, including a substrate, at least two features on the substrate, each including an outer conductive layer, and a diffusion barrier layer respectively disposed between each feature and the substrate, wherein a first impurity region of the substrate contains impurities of a first type, a second impurity region of the substrate contains impurities of a second type, different from the first type, a first feature of the at least two features is in the first impurity region, a second feature of the at least two features is in the second impurity region, such that the second feature is electrically isolated from first feature by the different impurity regions, and each respective diffusion barrier layer may extend laterally to an outer edge of the corresponding conductive layer and may be exposed by the corresponding conductive layer.

The conductive layer may contact a top surface of the diffusion barrier layer. Each feature may include a core material having a different composition from the conductive layer. The core material may include one or more of copper or nickel. The conductive layer may include one or more of nickel, gold, palladium, tin, or indium. The diffusion barrier layer may include one or more of titanium, chromium, or aluminum. The diffusion barrier layer may include one or more of a titanium-nitrogen compound or a titanium-tungsten compound.

The at least two features may be bumps that are configured to provide electrical signals between the semiconductor device and a second substrate. The at least two features may be wiring lines.

At least one of the above and other advantages may also be realized by providing a display device, including a display and a display driver integrated circuit coupled to the display, wherein the display is configured to reproduce an image in response to signals provided by the display driver integrated circuit, and the display driver integrated circuit includes a substrate, at least two features on the substrate, each including an outer conductive layer, and a diffusion barrier layer respectively disposed between each feature and the substrate, wherein a first impurity region of the substrate contains impurities of a first type, a second impurity region of the substrate contains impurities of a second type, different from the first type, a first feature of the at least two features is in the first impurity region, a second feature of the at least two features is in the second impurity region, such that the second feature is electrically isolated from first feature by the different impurity regions, and each respective diffusion barrier layer may extend laterally to an outer edge of the corresponding conductive layer and may be exposed by the corresponding conductive layer.

At least one of the above and other advantages may also be realized by providing a method of manufacturing a semiconductor device, including forming a diffusion barrier layer on a substrate, forming at least two features on the substrate such that the diffusion barrier layer is respectively disposed between each feature and the substrate, the diffusion barrier layer electrically connecting the at least two features, electro-less plating an outer conductive layer on the at least two features while the at least two features are electrically connected by the diffusion barrier layer, and selectively removing the diffusion barrier layer so as to interrupt the electrical connection.

At least one of the above and other advantages may also be realized by providing a semiconductor device, including a substrate, a first feature and a second feature on the substrate, a first diffusion barrier between the substrate and the first feature, a first conductive layer on the first feature, a second diffusion barrier between the substrate and the second feature, and a second conductive layer on the second feature, wherein the first conductive layer contacts a top surface of the first diffusion barrier, and the second conductive layer contacts a top surface of the second diffusion barrier.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Figure 1:
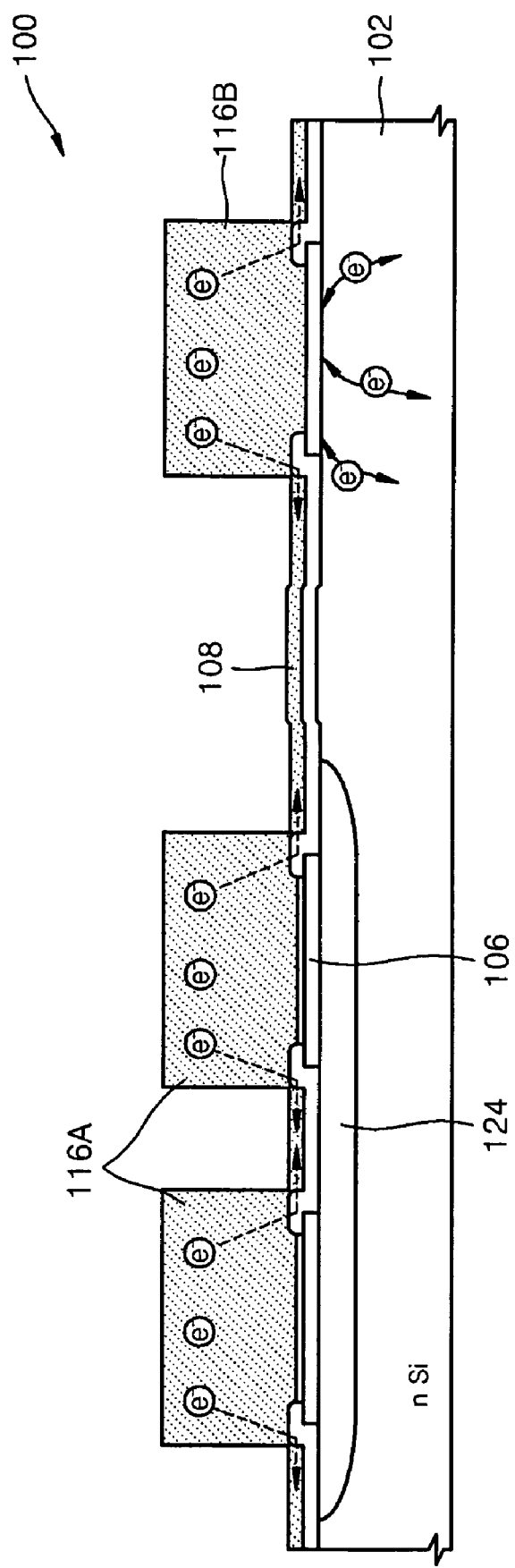
FIG. 1 illustrates a schematic of an electro-less plating operation.

Korean Patent Application No. 10-2007-0038981, filed on Apr. 20, 2007, in the Korean Intellectual Property Office, and entitled: "Method for a semiconductor device manufacturing having an even coating thickness in electro-less plating," is incorporated by reference herein in its entirety.

Embodiments will now be described more fully hereinafter with reference to the accompanying drawings; however, they should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Where an element is described as being connected to a second element, the element may be directly connected to second element, or may be indirectly connected to second element via one or more other elements. Further, where an element is described as being connected to a second element, it will be understood that the elements may be electrically connected, e.g., in the case of transistors, capacitors, power supplies, nodes, etc. In the figures, the dimensions of regions may be exaggerated and elements may be omitted for clarity of illustration. Like reference numerals refer to like elements throughout.

FIG. 1 illustrates a schematic of an electro-less plating operation. Referring to FIG. 1, a semiconductor device 100 being manufactured may include a substrate 102, e.g., a semiconductor substrate, having features 116, e.g., bumps 116A and 116B. The features 116 may be conductors that are provided for passing signals, e.g., control signals, data, power, ground, etc. into and out of the semiconductor device 100. The features 116 may be, e.g., bumps on a device bonding pad. In an implementation the features 116 may be, e.g., a signal terminal bump 116A and a ground bump 116B.

The semiconductor device 100 may also include device bonding pads 106 respectively corresponding to the bumps 116A, 116B. A well region 124, e.g., a doped impurity region, may isolate the bumps 116A from the substrate 102. In an implementation, the substrate 102 may be doped with an n-type impurity and the well region 124 may be doped with a p-type impurity.

The semiconductor device 100 may also include a diffusion barrier layer 108 disposed between the bumps 116A and the bumps 116B. The diffusion barrier layer 108 may electrically connect one or more bumps 116A to one or more bumps 116B.

The diffusion barrier layer 108 may serve to normalize a voltage potential between a bump 116A, which is isolated by the well region 124, and a bump 116B, which is not isolated by the well region 124. The diffusion barrier layer 108 may reduce or eliminate a voltage potential between the bumps 116A and 116B during electro-less plating. For example, where the bump 116A is a signal bump and the bump 116B is a ground bump, the voltage potential may be normalized by allowing electrons to move from the ground bump 116B toward the signal bump 116A through the diffusion barrier layer 108.

In view of the electron flow through the diffusion barrier layer 108, each of the bumps 116A and 116B may have an equal or substantially equal supply of electrons, which may enable an electro-less plating reaction to occur equally at the surface of each of the bumps 116A and 116B, such that equal amounts of material, e.g., metal, are deposited on each of the bumps 116A and 116B. Accordingly, the electro-less plating process may yield a plated layer having a substantially uniform thickness with respect to the bumps 116A and 116B, which may improve the reliability of the semiconductor device 100 as compared to an electro-less plating process performed when a voltage potential between the bumps 116A and 116B is not normalized.

More particularly, in the absence of an electrical connection connecting the bump 116A to the bump 116B, the bump 116A may not be at a same electrical potential as the bump 116B. In particular, the well region 124 may isolate the bump 116A from the substrate 102, such that a flow of electrons between the substrate and the bump 116A is different from a flow of electrons between the substrate 102 and the bump 116B. This may result in variations in electro-less plating conditions between the bump 116A and the bump 116B. For example, electro-less plating may be less effective for the bump 116A than for the bump 116B, which is not isolated from the substrate.

FIGS. 2A-2I illustrate stages in a method of manufacturing a semiconductor device according to a first embodiment, including stages before and after the electro-less plating stage illustrated in FIG. 1. In the description that follows, the fabrication of only one bump of the bumps 116A and 116B will be described. However, it will be appreciated that fabrication of the other of the bumps 116A and 116B may proceed in similar fashion. Accordingly, details of the fabrication of the other of the bumps 116A and 116B will not be repeated.

Figure 2A:
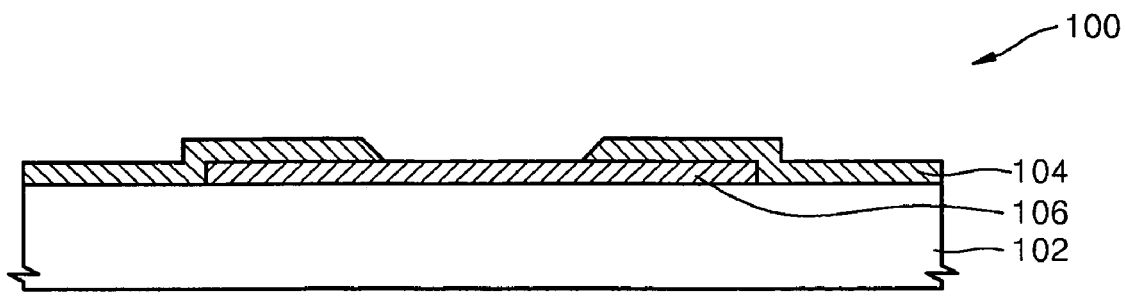
FIGS. 2A-2I illustrate stages in a method of manufacturing a semiconductor device according to a first embodiment.

Referring to FIG. 2A, the substrate 102 may have the device bonding pad 106 thereon. The bonding pad 106 may be in region of the substrate 102 that is isolated by an impurity well such as the well 124 described above, or may be in a region of the substrate 102 that is not isolated. As shown in FIG. 2A, a passivation layer 104 may be formed on the substrate 102. The passivation layer 104 may partially cover the bonding pad 106.

Figure 2B:
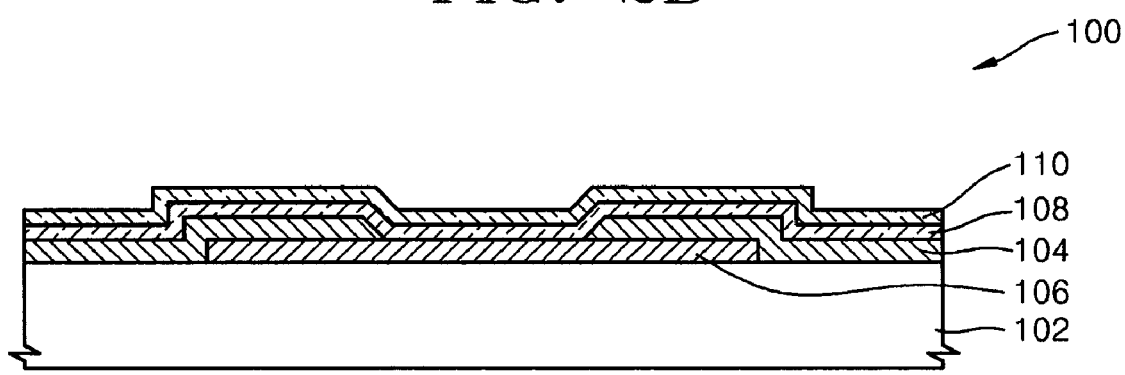

Referring to FIG. 2B, the diffusion barrier layer 108 may be formed on the passivation layer 104. The diffusion barrier layer 108 may include one or more of titanium, chromium, or aluminum. In an implementation, the diffusion barrier layer 108 may include one or more of a titanium-nitrogen compound or a titanium-tungsten compound. The diffusion barrier layer 108 may have a thickness of about 3000 Å. A seed layer 110 may be formed on the diffusion barrier layer 108. The seed layer 110 may include copper and may have a thickness of about 2000 Å. The seed layer 110 may act as a seed metal layer for forming a feature 116, e.g., a bump, on the bonding pad 106 in a subsequent operation. For example, the seed layer 110 may include Ni or a Ni—Cu alloy, and the feature 116 to be formed later may also include Ni or a Ni—Cu alloy, respectively. In an implementation (not shown), in a case where a titanium layer is used as the diffusion barrier layer 108, the seed layer 110 may include a titanium nitride layer and a copper layer on top of the titanium nitride layer.

Figure 2C:
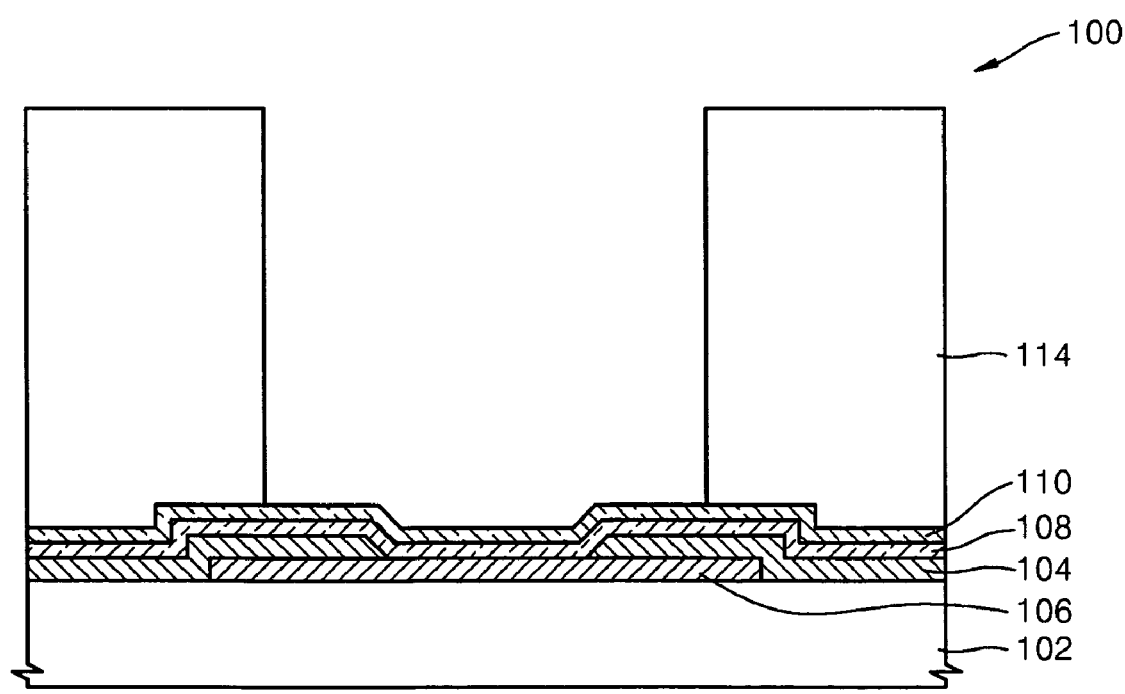

Referring to FIG. 2C, a photoresist layer 114 may be formed on the substrate and patterned to define a region in which the feature 116 is to be formed. The photoresist layer 114 may be applied and patterned using well-known techniques, the details of which will not be repeated here. The patterned photoresist layer 114 may expose an area overlying the bonding pad 106.

Figure 2D:
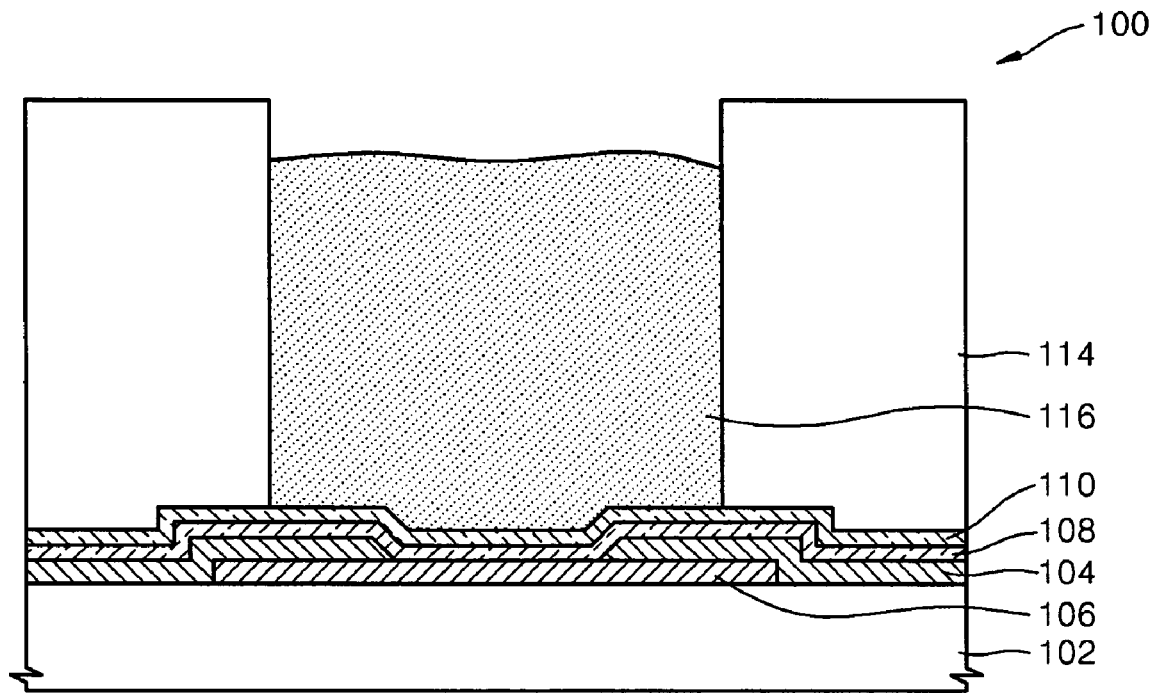
Figure 2E:
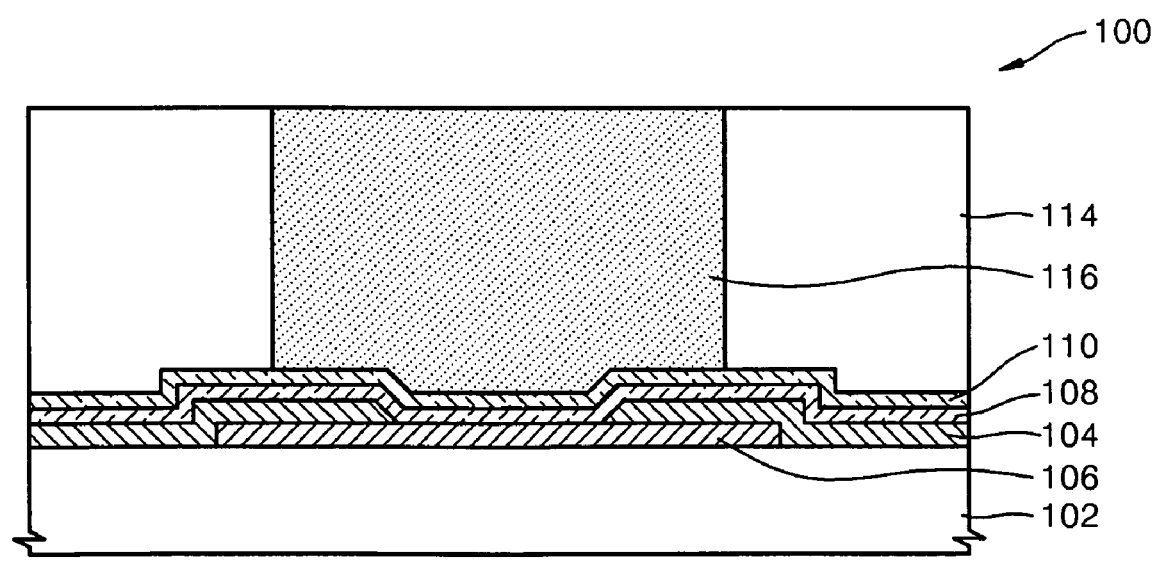
Figure 2F:
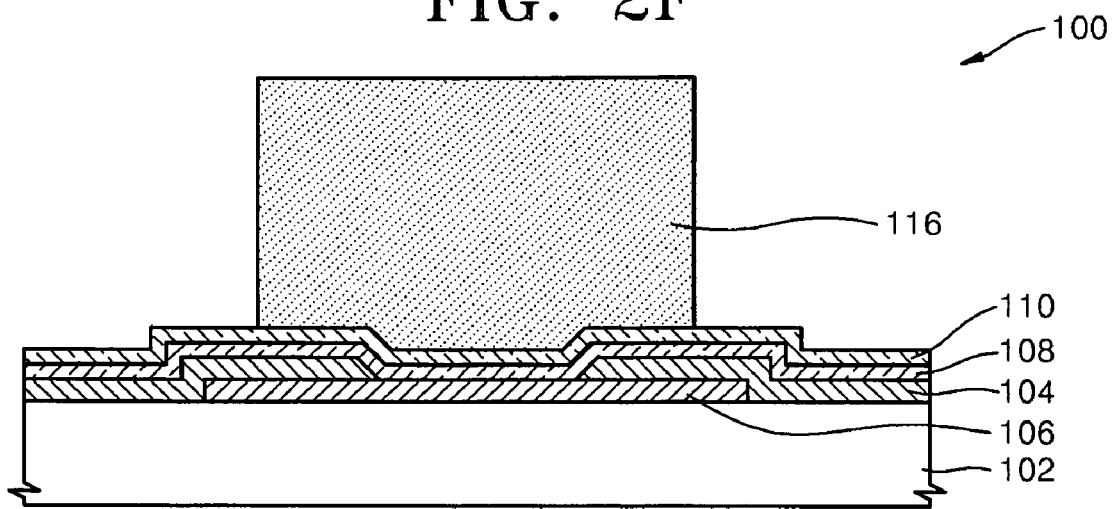

Referring to FIG. 2D, the feature 116 may be formed in the area defined by the patterned photoresist layer 114. The feature 116 may be formed using, e.g., electroplating or electroless plating. The feature 116 may be nickel, copper, a copper-nickel alloy, etc. The feature 116 may be formed to a height less than that of the photoresist layer 114, or may be formed to a height greater than that of the photoresist layer 114 (not shown). In either case, a planarization process may be performed to planarize the upper surface of the feature 116, as shown in FIG. 2E. Subsequently, the photoresist layer 114 may be removed, as shown in FIG. 2F.

Figure 2G:
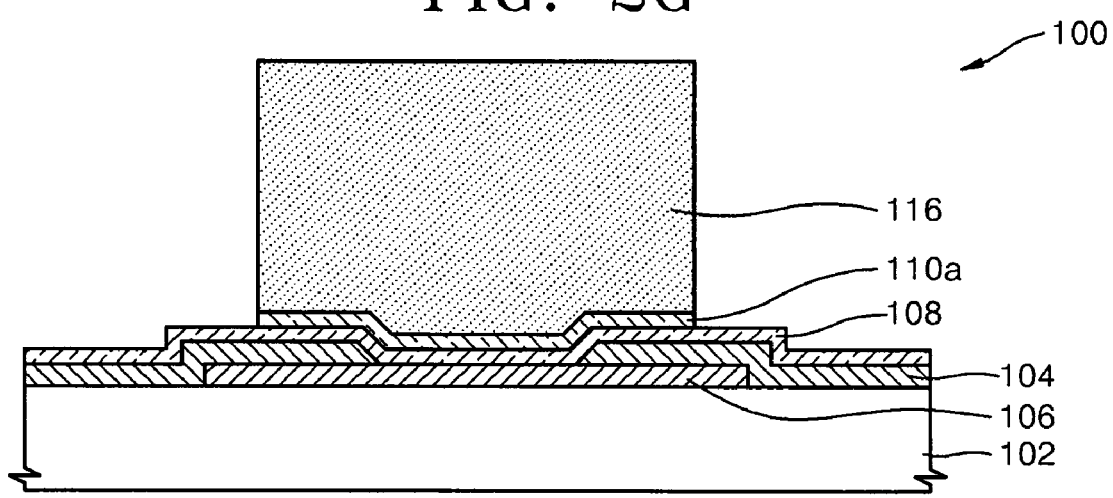

Referring to FIG. 2G, portions of the seed layer 110 that are exposed after removing the photoresist layer 114 may be removed to expose the underlying diffusion barrier layer 108, e.g., using an etch process. The etch process may selectively remove the seed layer 110 with respect to the diffusion barrier layer 108, such that the diffusion barrier layer 108 remains. Selectively removing the seed layer 110 may leave a portion 110a of the seed layer between the diffusion barrier layer 108 and the overlying feature 116.

In another implementation, as described above, the seed layer 110 may include a titanium layer, and the diffusion barrier layer 108 may include a titanium nitride layer and a copper layer on top of the titanium nitride layer. In this case, the copper top layer may be removed to expose the titanium nitride layer, and electro-less plating (described below) may be performed in this configuration. However, if electro-less plating deposits material on the titanium nitride layer, the titanium nitride layer may also be removed, and electro-less plating may be performed with the titanium layer exposed.

The diffusion barrier layer 108 may electrically connect the feature 116 to an adjacent feature 116. For example, referring again to FIG. 1, the diffusion barrier layer 108 may electrically connect the bump 116A that is disposed in the well 124 region of the substrate 102 to the bump 116B that is disposed outside the well 124 region.

In an implementation, the exposed region of the diffusion barrier layer 108 may be subjected to a surface treatment in order to reduce or eliminate the deposition of material thereon during a subsequent electro-less plating operation. For example, the exposed region of the diffusion barrier layer 108 may be subjected to an oxygen plasma treatment, e.g., for a duration of about 60 seconds, which may impart insulating characteristics to the exposed surface. The oxygen plasma treatment may increase the sheet resistance of the surface of the diffusion barrier layer 108 by about 0.5% to about 5%.

Table 1 below shows effects of example oxygen plasma descum treatments on sheet resistivity of a 3,000 Å thick titanium diffusion barrier layer:

TABLE 1

(Sheet resistivity (Ω/square) of Ti (3,000 Å) as a diffusion barrier layer)

|  | As deposited | De-scum 60 s * 1 time | De-scum 60 s * 2 times | De-scum 60 s * 3 times | After 4 hours |
|---|---|---|---|---|---|
| Average | 2.064 | 2.086 | 2.090 | 2.094 | 2.096 |
| Max. | 2.137 | 2.161 | 2.166 | 2.169 | 2.172 |
| Min. | 2.004 | 2.024 | 2.027 | 2.031 | 2.033 |

Figure 2H:
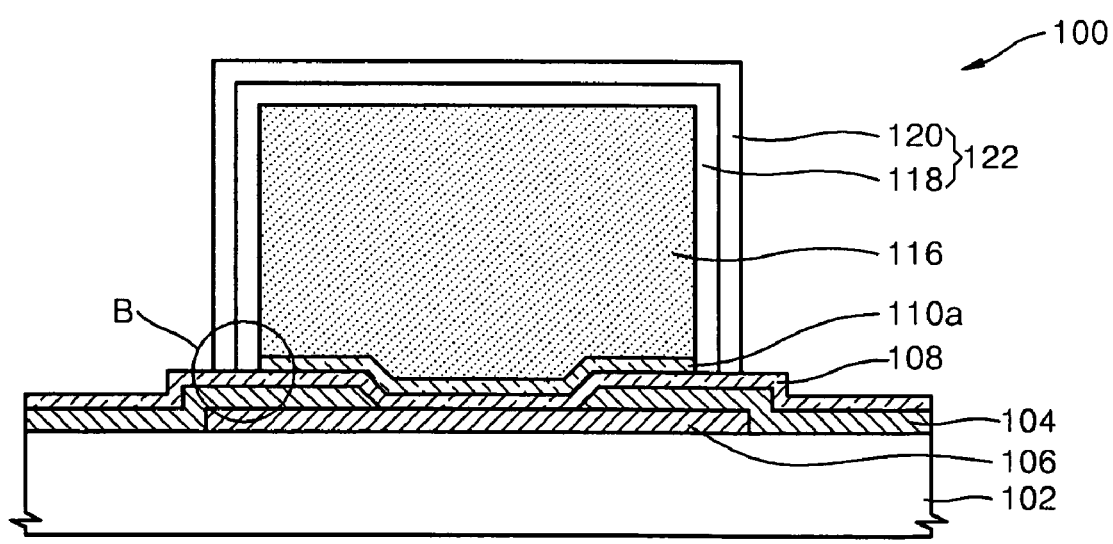

Referring to FIG. 2H, a conductive layer 122 may be formed on the surface of the feature 116. The conductive layer 122 may be formed using electro-less plating. The electro-less plating may uniformly form the conductive layer 122 on the feature 116 as well as on one or more features 116 that are electrically interconnected by the diffusion barrier layer 108. Thus, in the case of, e.g., the bumps 116A and 116B shown in FIG. 1, the electro-less plating may form the conductive layer 122 to a substantially uniform thickness on the bump 116A that is disposed in a well 124 region of the substrate 102, as well as on the bump 116B that is disposed outside the well 124 region.

Figure 2I:
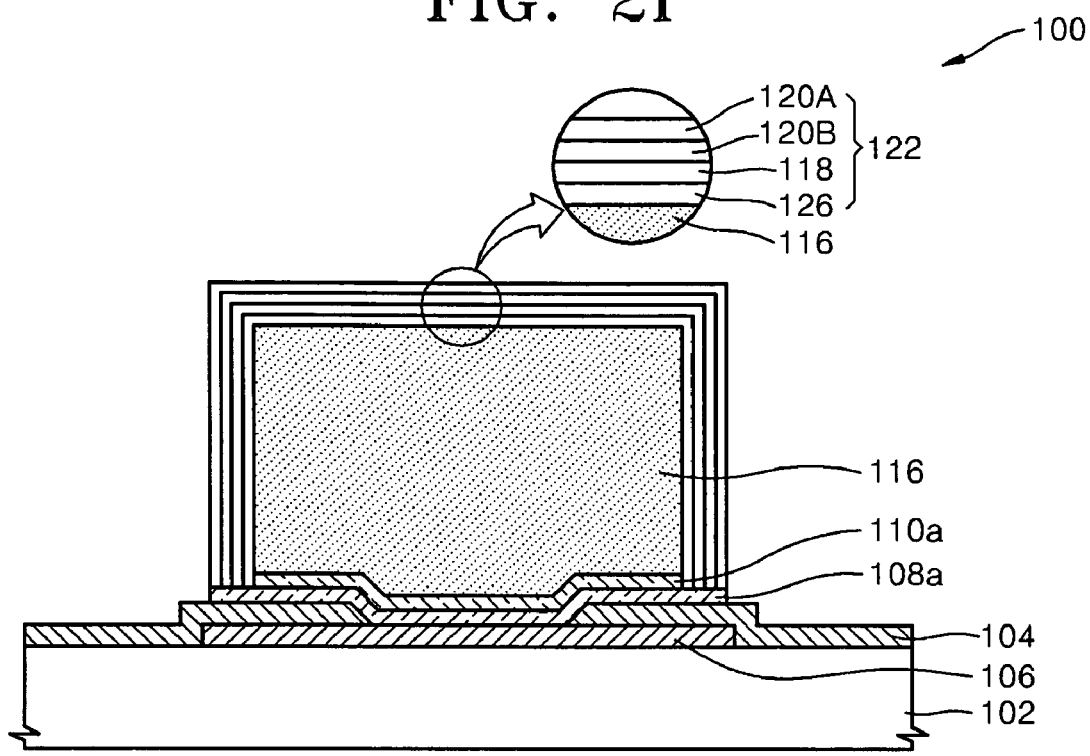

The conductive layer 122 may include one or more layers of differing materials, or may be a single layer. For example, the conductive layer 122 may include a double layer of nickel and gold, a single layer or multiple layers of gold, multiple layers including nickel, multiple layers including palladium, a single or multiple layers including tin, tin alloys, indium, etc. In an implementation, the conductive layer 122 may include a nickel layer 118 and a gold layer 120 formed on the nickel layer 118. In another implementation, the conductive layer 122 may include a palladium layer 126, a nickel layer 118, a first gold layer 120B and a second gold layer 120A, as shown in FIG. 2I.

For example, the conductive layer 122 may include the palladium layer 126 as the bottommost activation layer, the nickel layer 118, having a thickness of, e.g., about 0.4 μm, the first gold layer 120B, having a thickness of, e.g., about 0.1 μm, formed by a substitution reaction process, and the second gold layer 120A, having a thickness of, e.g., about 0.3 μm to about 0.4 μm, formed by a reduction reaction process. In detail, a precleaning operation may be performed, after which the palladium layer 126 may be formed using, e.g., a catalyst treatment. Subsequently, a nickel layer 118, which may serve as a diffusion barrier layer, may be formed using, e.g., NiP plating at a temperature of about 75° C. to about 90° C. The first and second gold layers 120B and 120A may be formed using a gold substitution reaction and a gold reduction reaction at a temperature of about 65° C. to about 85° C., respectively. After each operation, a cleaning may be performed using deionized water. Where a tin layer is included in the conductive layer 122, the tin may be deposited using electro-less plating at about 60° C. after a precleaning operation that includes cleaning with deionized water followed by soft etching using potassium persulfate, $K_2S_2O_8$. The hardness of the feature 116 may be adjusted using a heat treatment operation, e.g., heating to a temperature of about 250° C.

After forming the conductive layer 122, exposed portions of the diffusion barrier layer 108 may be removed, leaving a portion 108a of the barrier layer between the passivation layer 104 and the overlying portion 110a of the seed layer. Since the exposed portions of diffusion barrier layer 108 are removed after the conductive layer 122 is formed, the conductive layer 122 may cover the feature 116 and may extend along sides of the feature 116 to contact a top surface of the diffusion barrier layer 108, as shown in FIG. 2I. In an implementation, the conductive layer 122 may directly contact the diffusion barrier layer 108, and may directly contact the remaining portion 108a of the diffusion barrier layer after the selective removal of the exposed portions. The selective removal of the exposed portions of the diffusion barrier layer 108 may leave the remaining portion 108a having a lateral extent that is substantially aligned with the outer periphery of the conductive layer 122. The portion 110a of the seed layer may be completely encapsulated by the surrounding conductive layer 122, the overlying feature 116, and the underlying portion 108a of the diffusion barrier layer. Removing the exposed portions of the diffusion barrier layer 108 may interrupt the electrical path between the features 116. Thus, the diffusion barrier layer 108 may act as a diffusion barrier as well as provide the electrical path during electro-less plating, and the remaining portion 108a may remain after the electrical path is interrupted, so as to serve as a diffusion barrier in resultant device.

Figure 3A:
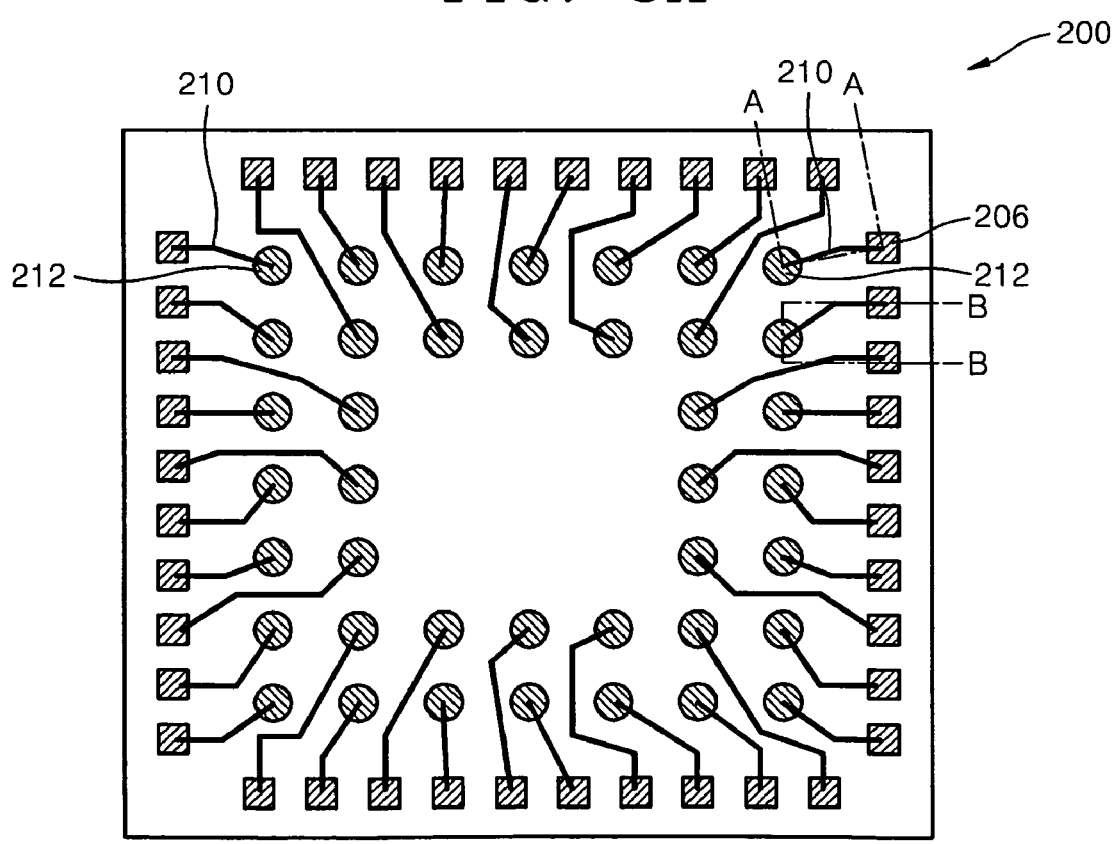
FIG. 3A illustrates a plan view of an example semiconductor device according to a second embodiment.
Figure 3B:
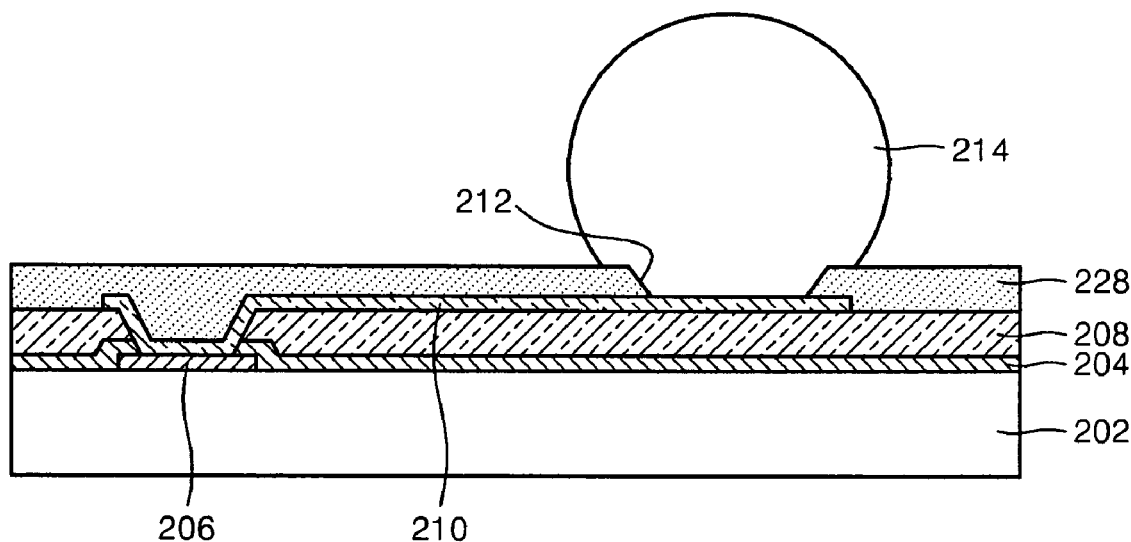
FIG. 3B illustrates a sectional view of the semiconductor device of FIG. 3A, taken along a line A-A of FIG. 3A.

A second embodiment will now be described in connection with FIGS. 3A, 3B, and 4A-4G. In this embodiment, the feature 116 described above may be implemented as a wiring pattern, e.g., a redistribution pattern 210, on a semiconductor device 200. FIG. 3A illustrates a plan view of an example semiconductor device according to the second embodiment. FIG. 3B illustrates a sectional view of the semiconductor device of FIG. 3A, taken along a line A-A of FIG. 3A. Referring to FIG. 3A, the redistribution pattern 210 may redistribute bonding regions such that, for example, peripheral bonding pads 206 are connected to respective redistributed bonding pads 212, which may be formed in an interior region of the semiconductor device 200.

Referring to FIG. 3B, the bonding pad 206 may be disposed on a substrate 202. A passivation layer 204 may be disposed on the substrate 202 and may partially cover the bonding pad 206. A first dielectric layer 208 may be disposed on the substrate 202 so as to cover the passivation layer 204 and expose a region overlying the bonding pad 206. The redistribution pattern 210 may be disposed in contact with the bonding pad 206 in the region exposed by the passivation layer 204, and may extend along a surface of the the first dielectric layer 208 towards the region where the redistributed bonding pad 212 is located. A second dielectric layer 228 may cover the first dielectric layer 208 and the redistribution pattern 210, and may have an opening exposing a region of the redistribution pattern 210 to form the redistributed bonding pad 212. A solder ball 214, a bump, etc., may be disposed on the redistributed bonding pad 212 and may provide electrical contact with an adjacent substrate such as a printed circuit board, etc., (not shown).

The redistribution pattern 210 may be formed in similar fashion to the features 116 described above. In particular, an electro-less plating operation may be performed while multiple redistribution patterns 210 are electrically connected by a diffusion barrier 216, which is described in detail below. The electrical connection provided by the diffusion barrier 216 may allow the electrical potential of redistribution patterns 210 connected thereby to be normalized, which may improve the uniformity of a conductive layer formed on the redistribution patterns 210.

Figure 4A:
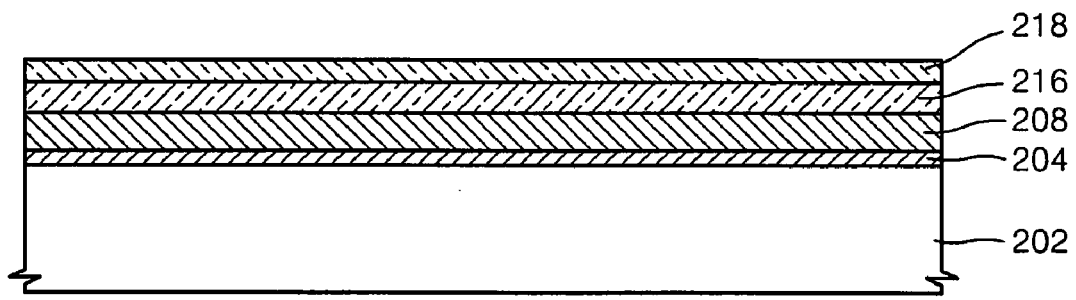
FIGS. 4A-4G illustrate cross-sectional views of stages in a method of manufacturing the semiconductor device shown in FIG. 3A, taken along a line B-B of FIG. 3A.

FIGS. 4A-4G illustrate cross-sectional views of stages in a method of manufacturing the semiconductor device 200 described above in connection with FIG. 3A, taken along a line B-B of FIG. 3A. Referring to FIG. 4A, the passivation layer 204 may be formed on the substrate 202. The passivation layer 204 may be patterned to expose a portion of the bonding pad 206 (see FIGS. 3A and 3B). The first dielectric layer 208 may be formed on the substrate 202 and may cover the passivation layer 204. The first dielectric layer 208 may be patterned to expose the bonding pad 206.

The diffusion barrier layer 216 may be formed on the first dielectric layer 208 and on the exposed portion of the bonding pad 206, and a seed layer 218 may be formed on the diffusion barrier layer 216. In an implementation, the diffusion barrier layer 216 may include Ti, Cr, Al, TiN, and/or TiW, and the seed layer 218 may include Cu, Ni, and/or Cu—Ni alloy. In another implementation, the diffusion barrier 216 and the seed layer 218 may include a three-layer structure of Ti/TiN/Cu.

Figure 4B:
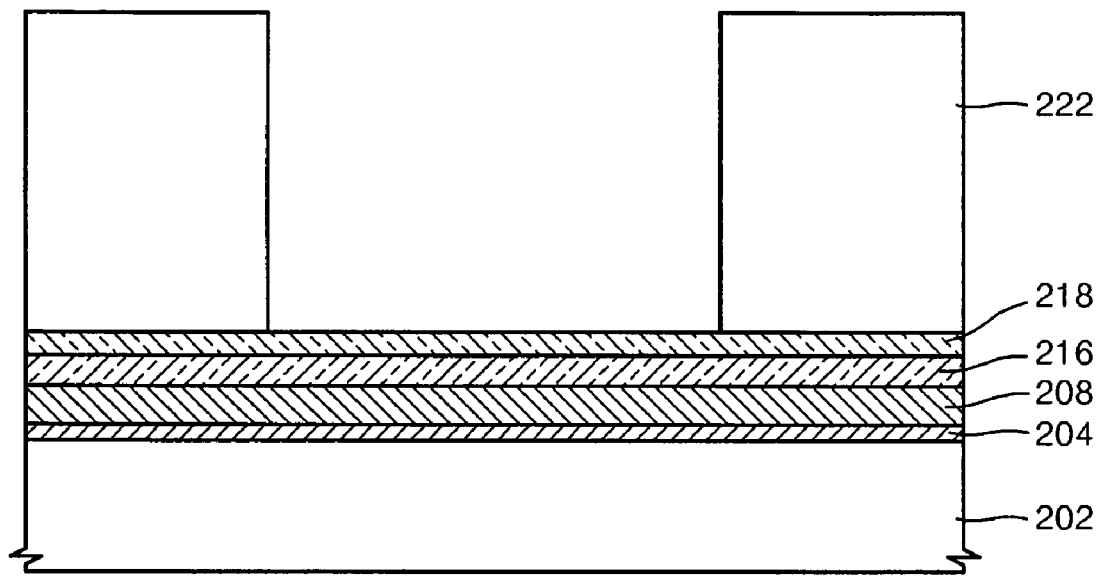

Referring to FIG. 4B, a photoresist layer 222 may be formed on the seed layer 218. The photoresist layer 222 may be patterned to form an opening that exposes a portion of the seed layer 218 that overlies the bonding pad 206, and which defines a channel in which the redistribution pattern 210 is to be formed.

Figure 4C:
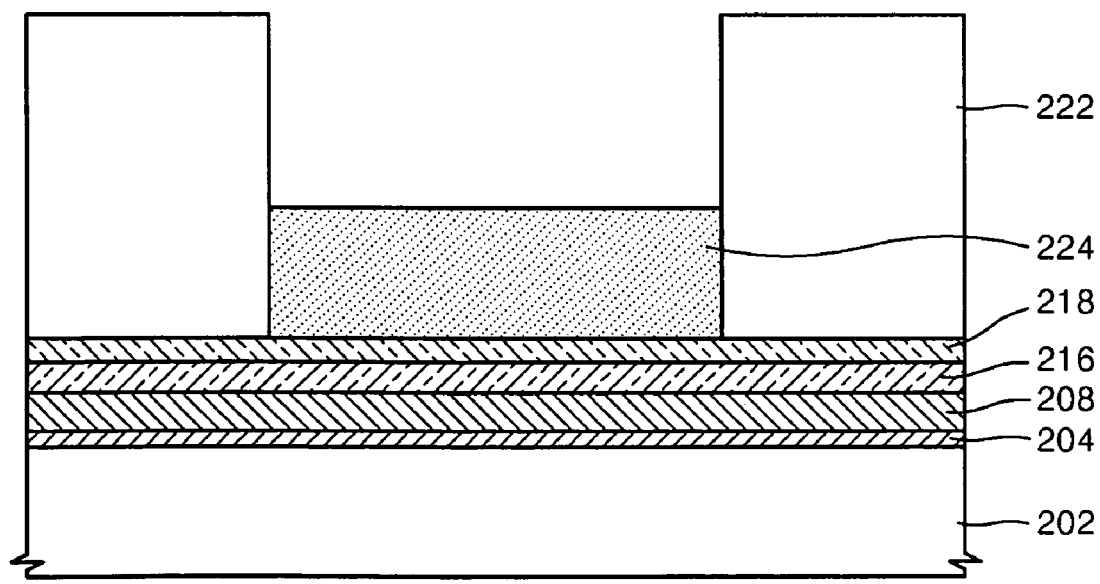
Figure 4D:
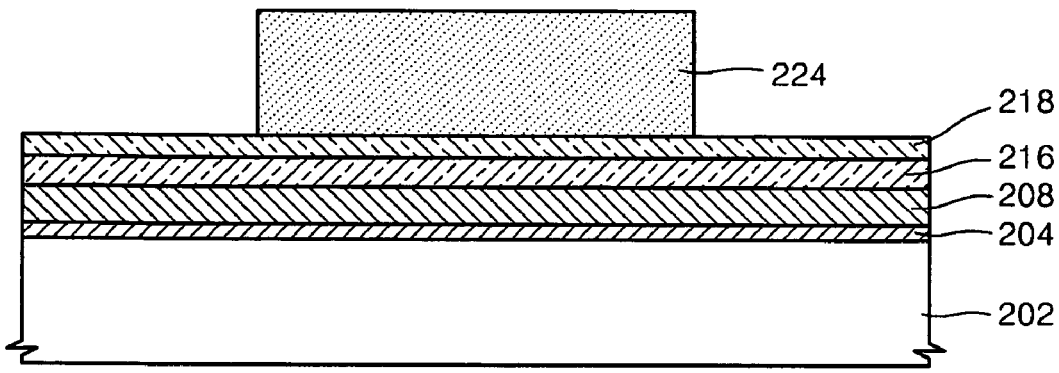

Referring to FIG. 4C, forming the redistribution pattern 210 (see FIGS. 3A and 3B) may include electroplating or electro-less plating a material in the opening in the photoresist layer 222 to form a core pattern 224 for the redistribution pattern 210. The core pattern 224 may include, e.g., Cu, Ni, or Cu—Ni alloy, and may be formed by electroplating or electro-less plating. In an implementation, copper may be plated in the opening to a thickness of, e.g., about 3 µm to about 5 µm. The thickness of the plated material may be greater or smaller than that of the photoresist layer 222, and the plated material and photoresist layer 222 may be planarized in the same manner as described above in connection with FIG. 2E. The remaining photoresist layer 222 may then be removed, as shown in FIG. 4D.

Figure 4E:
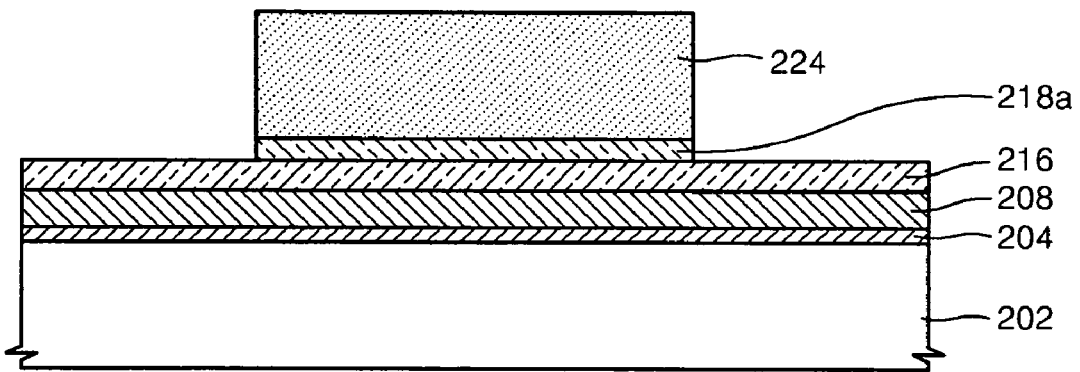

Referring to FIG. 4E, portions of the seed layer 218 that are exposed as a result of the removal of the photoresist layer 222 may be selectively removed from around the core pattern 224, e.g., using an etch process, such that the core pattern 224 and the remaining portion 218a of the seed layer are substantially coextensive. As described above in connection with the first embodiment, the removal of the seed layer 218 may be selective with respect to the underlying diffusion barrier layer 216, such that the diffusion barrier layer 216 remains and provides an electrical path between multiple core patterns 224 at this stage in the exemplary redistribution pattern forming process. Accordingly, a subsequent operation of electro-less plating an outer layer on the core patterns 224 may be performed while the core patterns 224 are electrically connected. Thus, the electro-less plating may be used to produce redistribution patterns 210 that have an outer layer plated thereon that has a substantially uniform thickness.

In an implementation, the surface of the diffusion barrier layer 216 may be subjected to an oxygen plasma treatment before performing electro-less plating, which may increase the sheet resistance of the diffusion barrier layer 216 by, e.g., about 0.5% to about 5%.

Figure 4F:
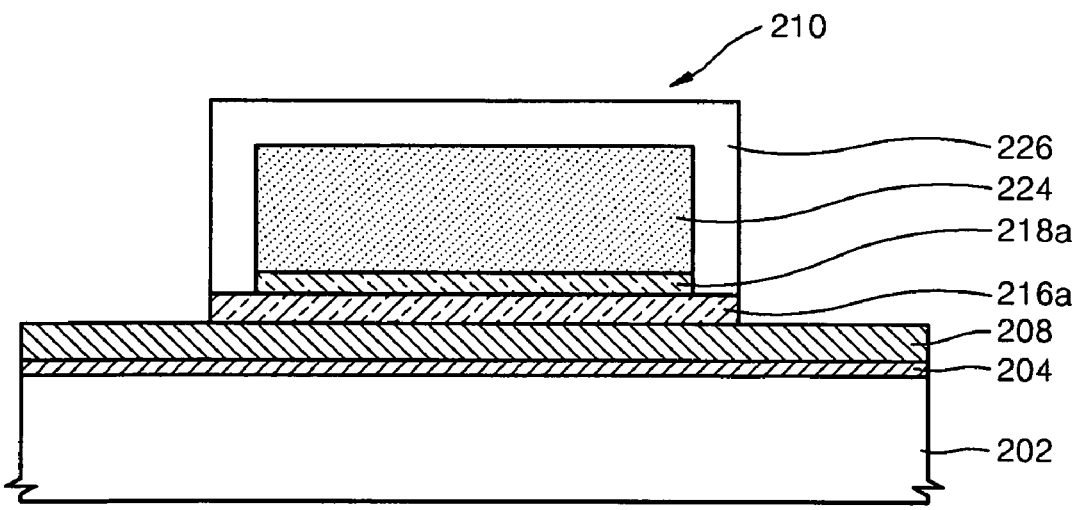

Referring to FIG. 4F, an outer conductive layer 226 may be plated on the core pattern 224 using electro-less plating. The outer conductive layer 226 may have a thickness of, e.g., about 1 µm to about 3 µm. As illustrated in FIG. 4F, the outer conductive layer 226 may cover the top and sides of the core pattern 224, such that the core pattern 224 is not exposed in the redistribution pattern 210. This may be particularly advantageous in the case of, e.g., a copper core pattern 224, since the outer conductive layer 226 may prevent oxidation of the core pattern 224 and may prevent the copper from diffusing into adjacent material layers.

The conductive layer 226 may include one or more layers of differing materials, or may be a single layer. For example, the conductive layer 226 may include a double layer of nickel and gold, a single layer or multiple layers of gold, multiple layers including nickel, multiple layers including palladium, a single or multiple layers including tin, tin alloys, indium, etc. In an implementation, the conductive layer 226 may include a nickel layer and a gold layer formed on the nickel layer. In another implementation, the conductive layer 226 may include a palladium layer, a nickel layer, a first gold layer and a second gold layer, in a similar configuration to that described above in connection with FIG. 2I.

For example, the conductive layer 226 may include the palladium layer as the bottommost activation layer, the nickel layer having a thickness of, e.g., about 0.4 µm, the first gold layer having a thickness of, e.g., about 0.1 µm, formed by a substitution reaction process, and the second gold layer having a thickness of, e.g., about 0.3 µm to about 0.4 µm, formed by a reduction reaction process. In detail, a precleaning operation may be performed, after which the palladium layer may be formed using, e.g., a catalyst treatment. Subsequently, a nickel layer, which may serve as a diffusion barrier layer, may be formed using, e.g., NiP plating at a temperature of about 75° C. to about 90° C. The first and second gold layers may be formed using a gold substitution reaction and a gold reduction reaction at a temperature of about 65° C. to about 85° C., respectively. After each operation, a cleaning may be performed using deionized water. Where a tin layer is included in the conductive layer 226, the tin may be deposited using electro-less plating at about 60° C. after a precleaning operation that includes cleaning with deionized water followed by soft etching using potassium persulfate, $K_2S_2O_8$. The hardness of the feature may be adjusted using a heat treatment operation, e.g., heating to a temperature of about 250° C.

After the electro-less plating, exposed portions of the diffusion barrier layer 216 may be selectively removed, leaving a portion 216a of the diffusion barrier layer between the first dielectric layer 208 and the overlying portion 218a of the seed layer. Thus, in similar fashion to the first embodiment described above in connection with FIGS. 2A-2I, the conductive layer 226 may cover the copper core pattern 224 and may extend along sides of the copper core pattern 224 to contact a top surface of the diffusion barrier layer 216. The conductive layer 226 may directly contact the diffusion barrier layer 216, and may directly contact the remaining portion 216a of the diffusion barrier layer after the selective removal of the exposed portions. The selective removal of the exposed portions of the diffusion barrier layer 216 may leave the remaining portion 216a having a lateral extent that is substantially aligned with the outer periphery of the conductive layer 226. The portion 218a of the seed layer may be completely encapsulated by the surrounding conductive layer 226, the overlying copper core pattern 224, and the underlying portion 216a of the diffusion barrier layer. Removing the exposed portions of the diffusion barrier layer 216 may interrupt the electrical path between copper core patterns 224. Thus, the diffusion barrier 216 may act as a diffusion barrier as well as provide the electrical path during electro-less plating, and the remaining portion 216a may remain after the electrical path is interrupted, so as to serve as a diffusion barrier in the resultant device.

Figure 4G:
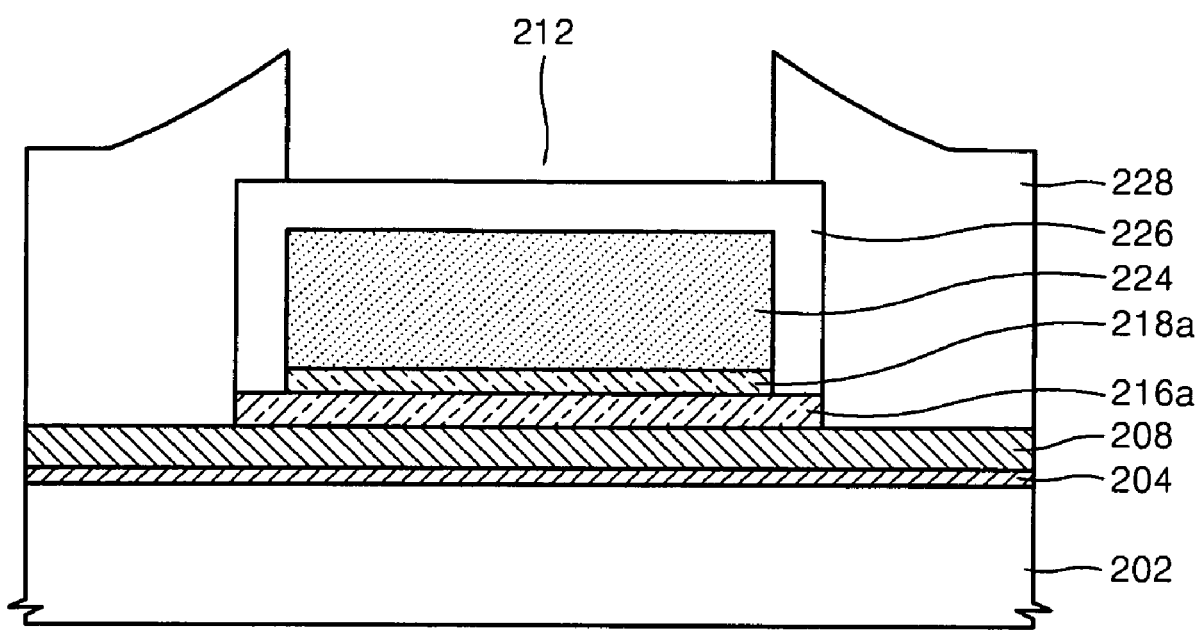

Referring to FIG. 4G, a second dielectric layer 228 may be formed on the substrate 202. The second dielectric layer 228 may be patterned to expose a top portion of the outer conductive layer 226 of the redistribution pattern 210, the exposed portion corresponding to a location of the redistributed bonding pad 212 (see also FIG. 3B). The solder ball 214, a bump, etc., may be disposed on the redistributed bonding pad 212 to enable an electrical connection to an adjacent substrate or element.

Figure 5:
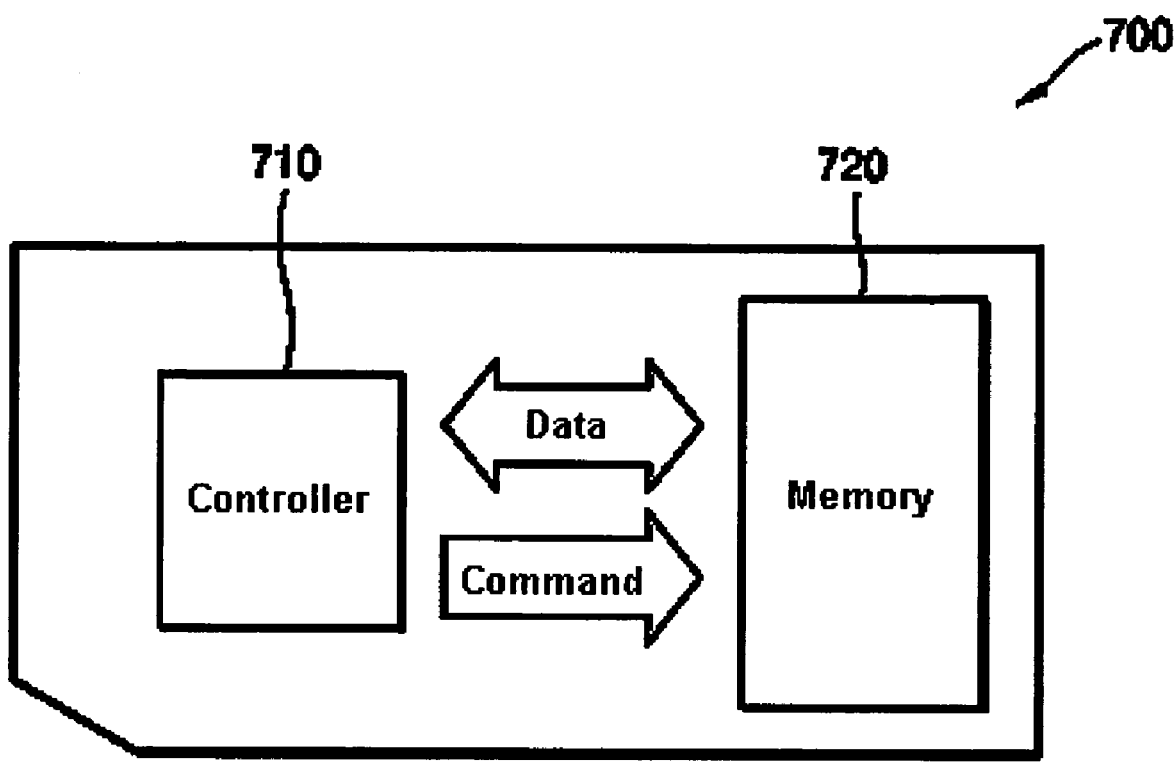
FIG. 5 illustrates an example memory card according to a third embodiment.

FIG. 5 illustrates an example memory card system 700, e.g., a multi-media card (MMC) or a secure digital (SD) card, according to a third embodiment. Referring to FIG. 5, the card 700 may include a controller 710 and a memory 720. The memory 720 may be, e.g., a flash memory, a PRAM, a DRAM, etc. An interface may be provided for exchanging data and commands (instructions) between the controller 710 and the memory 720). Another interface, e.g., a standard MMC or SD interface, may be provided for exchanging information with another device (not shown). The memory 720, the controller 710, and the interface therebetween may be packaged together as a multi-chip package (MCP).

Figure 6:
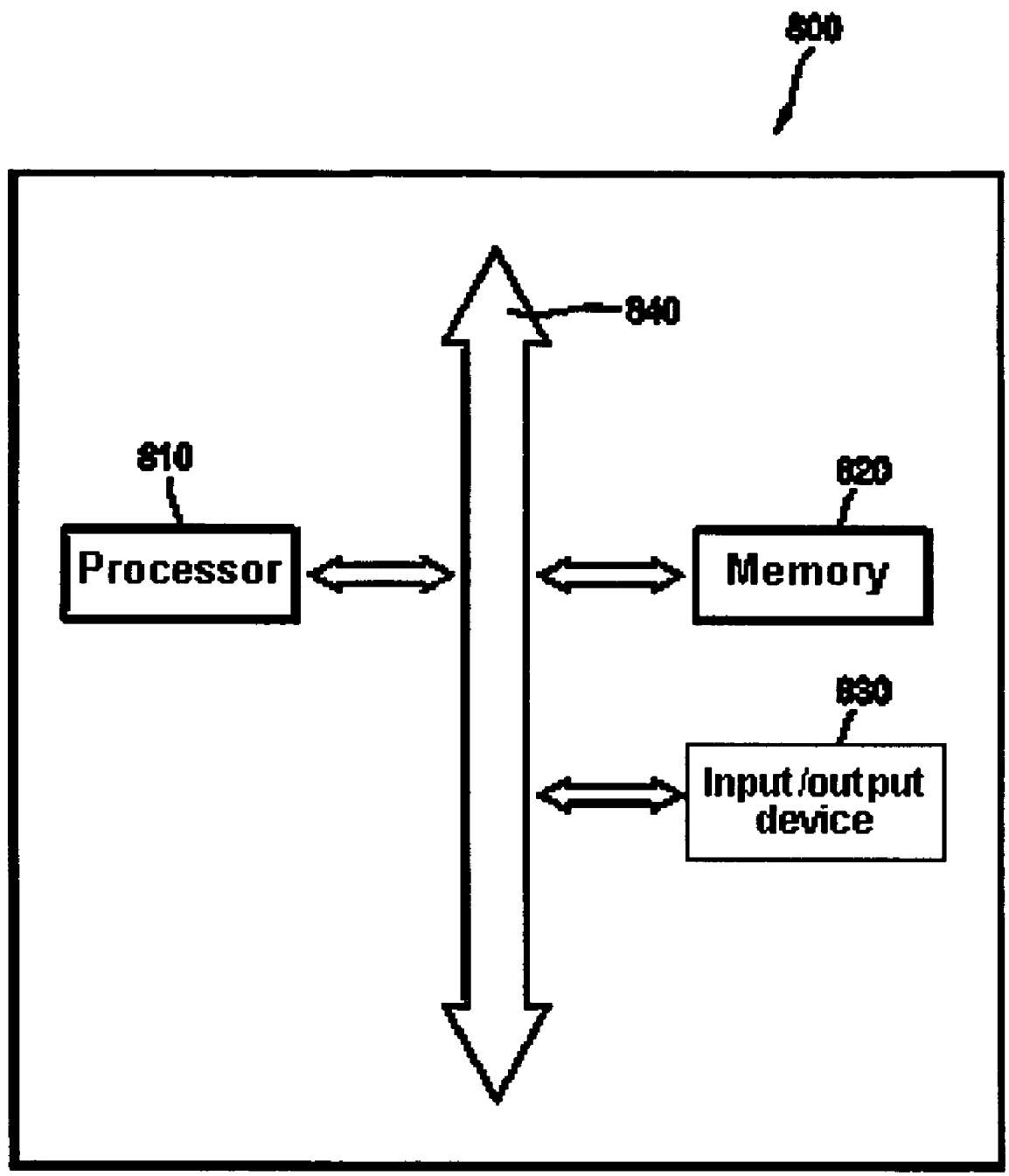
FIG. 6 illustrates an example electronic system according to a fourth embodiment.

FIG. 6 illustrates an example electronic system 800 according to a fourth embodiment. Referring to FIG. 6, the system 800 may include a processor 810, a memory 820, at least one I/O (input/output) device 830, and at least one bus 840. The system 800 may be, e.g., a mobile phone, an MP3 device, a navigation system, a solid state disk (SSD), a household appliance, etc. The memory 820, the processor 810, the I/O device 830, and the bus 840 may be packaged together as an MCP. In an implementation, one, some, or all of the components (memory 820, the processor 810 and the I/O device 840) may be packaged together, e.g., being vertically stacked together as an MCP.

Figure 7:
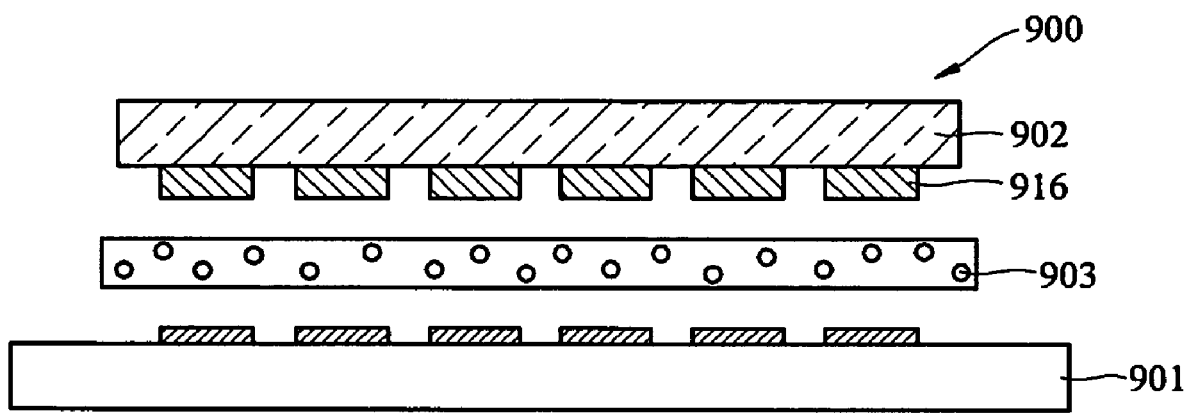
FIG. 7 illustrates an example display device according to a fifth embodiment.

FIG. 7 illustrates an example display device 900 according to a fifth embodiment. The display device 900 may include a display 901 and a display driver integrated circuit 902 coupled to the display, e.g., coupled using an anisotropic conductive film 903. The display 901 may be configured to reproduce an image in response to signals provided by the display driver integrated circuit 902. The display driver integrated circuit 902 may include a substrate, e.g., a semiconductor substrate, having at least two features 916 thereon. The features 916 on the substrate may be features as described above having an outer conductive layer and a diffusion barrier layer respectively disposed between each feature and the substrate. A first impurity region of the substrate may contain impurities of a first type, and a second impurity region of the substrate may contain impurities of a second type, different from the first type. A first feature of the at least two features may be in the first impurity region, and a second feature of the at least two features may be in the second impurity region, such that the second feature is electrically isolated from first feature by the different impurity regions. Each respective diffusion barrier layer may extend laterally to an outer edge of the corresponding conductive layer and may be exposed by the corresponding conductive layer.

Exemplary embodiments have been disclosed herein, and although specific terms are employed, they are used and are to be interpreted in a generic and descriptive sense only and not for purpose of limitation. Thus, although specific embodiments have been described above whereby a bump and a redistribution pattern may be plated using an electro-less plating method, the method may be similarly applied to other features. Moreover, the method may be applied to a device in which the features, e.g., bumps or wiring patterns, are not isolated by different impurity regions. For example, embodiments may provide a device, e.g., a display driver integrated circuit in a display device, and a method of manufacturing the same, in which a diffusion barrier layer is formed on a substrate, at least two features are formed on the substrate such that the diffusion barrier layer is respectively disposed between each feature and the substrate, the diffusion barrier layer electrically connecting the at least two features, an outer conductive layer is electro-less plated on the at least two features while the at least two features are electrically connected by the diffusion barrier layer, and the diffusion barrier layer is selectively removed so as to interrupt the electrical connection. The outer conductive layer may contact a top surface of the diffusion barrier layer, the method may include, before forming the at least two features, forming a seed layer on the diffusion barrier layer in regions corresponding to the at least two features, and a portion of the seed layer corresponding to one of the features may be encapsulated by the outer conductive layer, the feature, and the diffusion barrier layer.

Accordingly, it will be understood by those of ordinary skill in the art that various changes in form and details may be made without departing from the spirit and scope of the present invention as set forth in the following claims.

What is claimed is:

1. A method of manufacturing a semiconductor device, comprising:
    forming a diffusion barrier layer on a substrate; and
    forming at least two features on the substrate such that the diffusion barrier layer is respectively disposed between each feature and the substrate and contacts the at least two features, wherein:
    a first impurity region of the substrate contains impurities of a first type,
    a second impurity region of the substrate contains impurities of a second type, different from the first type,
    a first feature of the at least two features is in the first impurity region, and
    a second feature of the at least two features is in the second impurity region, such that the second feature is electrically isolated from first feature by the different impurity regions,
    wherein the diffusion barrier layer provides an electrical path between the at least two features, and
    the method further comprises:
        electro-less plating an outer conductive layer on the at least two features while the at least two features are connected by the electrical path; and
        after the electro-less plating, processing the diffusion barrier layer so as to interrupt the electrical path
    wherein:
    the conductive layer is plated on a surface of the features that includes one or more of copper or nickel,
    the conductive layer includes one or more of nickel, gold, palladium, tin, or indium, and
    the diffusion barrier layer includes one or more of titanium, chromium, or aluminum, and
    wherein the conductive layer includes:
        a palladium layer on the surface of each feature;
        a nickel layer on each palladium layer; and
        at least one gold layer on each palladium layer.

2. The method as claimed in claim 1, wherein processing the diffusion barrier layer so as to interrupt the electrical path includes removing the diffusion barrier layer from a region surrounding at least one of the at least two features.

3. The method as claimed in claim 1, wherein, after interrupting the electrical path, the diffusion barrier layer extends laterally to an outer edge of the conductive layer and is exposed by the conductive layer.

4. The method as claimed in claim 1, further comprising, after forming the diffusion barrier layer and before the electro-less plating, forming a seed layer on the substrate;
    selectively forming the at least two features on the seed layer; and selectively removing the seed layer from a region between the at least two features.

5. The method as claimed in claim 4, wherein the at least two features are formed by electroplating or electro-less plating.

6. The method as claimed in claim 4, wherein forming the at least two features includes:
   forming a seed layer on the substrate;
   forming a photoresist pattern on the substrate, the photoresist pattern having openings corresponding to the at least two features, the openings exposing the seed layer;
   depositing a material in the openings in the photoresist pattern using electroplating;
   planarizing the deposited material to form the at least two features;
   removing the photoresist pattern; and
   removing portions of the seed layer exposed on the substrate adjacent to the at least two features.

7. The method as claimed in claim 4, wherein the seed layer is conductive.

8. The method as claimed in claim 1, wherein a portion of the diffusion barrier layer that provides the electrical path is exposed during the electro-less plating.

9. The method as claimed in claim 8, further comprising, before the electro-less plating, subjecting the exposed portion of the diffusion barrier layer that provides the electrical path to an oxygen plasma surface treatment.

10. The method as claimed in claim 1, further comprising:
    forming a bonding pad between each of the at least two features and the substrate; and
    forming a passivation layer on the substrate, the passivation layer covering a portion of the bonding pad and exposing a portion of the bonding pad, wherein the diffusion barrier layer contacts the portion of the bonding pad exposed by the passivation layer.

* * * * *